(12) United States Patent
Stein et al.

(10) Patent No.: US 12,144,153 B2
(45) Date of Patent: Nov. 12, 2024

(54) ELECTRONIC CONTROL OF A COMPRESSOR, COMPRESSOR AND COOLING EQUIPMENT

(71) Applicant: EMBRACO INDÚSTRIA DE COMPRESSORES E SOLUÇÕES EM REFRIGERAÇÃO LTDA., Joinville (BR)

(72) Inventors: Felipe Guilherme Stein, Joinville (BR); Gabriel Grunitzki Facchinello, Joinville (BR); Roberto Geraldo Samistraro, Joinville (BR); Marcelo Alessandro Santos, Joinville (BR)

(73) Assignee: NIDEC GLOBAL APPLIANCE BRASIL LTDA., Joinville (BR)

( * ) Notice: Subject to any disclaimer, the term of this patent is extended or adjusted under 35 U.S.C. 154(b) by 141 days.

(21) Appl. No.: 17/601,008

(22) PCT Filed: Mar. 9, 2020

(86) PCT No.: PCT/BR2020/050074
§ 371 (c)(1),
(2) Date: Oct. 1, 2021

(87) PCT Pub. No.: WO2020/198825
PCT Pub. Date: Oct. 8, 2020

(65) Prior Publication Data
US 2022/0192056 A1    Jun. 16, 2022

(30) Foreign Application Priority Data
Apr. 2, 2019    (BR) .......................... 102019006685-7

(51) Int. Cl.
*H05K 7/20*    (2006.01)
*H05K 1/02*    (2006.01)
(Continued)

(52) U.S. Cl.
CPC ....... *H05K 7/20518* (2013.01); *H05K 1/0201* (2013.01); *H05K 1/0204* (2013.01);
(Continued)

(58) Field of Classification Search
CPC ........... H05K 7/20518; H05K 7/20454; H05K 7/209; H05K 7/1427; H05K 1/0201;
(Continued)

(56) References Cited

U.S. PATENT DOCUMENTS 6,704,202 B1 * 3/2004 Hamaoka ........... H05K 7/20463
62/505
2004/0197213 A1 * 10/2004 Takemoto .............. H02K 11/33
417/423.7
(Continued)

FOREIGN PATENT DOCUMENTS

EP    1 617 081 A2    1/2006
EP    1804561 A1 *    7/2007    ............. H05K 3/366

OTHER PUBLICATIONS

International Search Report & Written Opinion of the International Searching Authority issued in PCT Application No. PCT/BR2020/050074, mailed Jun. 17, 2020.

*Primary Examiner* — Zhengfu J Feng
(74) *Attorney, Agent, or Firm* — FOLEY & LARDNER LLP (57) ABSTRACT

The present invention refers to an electronic control (1) of a compressor (2), the electronic control (1) disposed in an encasement 5 (3), wherein the electronic control (1) comprises: a main board (4) associated to at least an auxiliary board (5,6,7), wherein one of the auxiliary boards (5,6,7) is a heat-generating board (7), wherein the heat-generating board (7) is disposed at a first distance ($D_1$) in relation to a first wall of the encasement ($P_1$), wherein the other auxiliary boards 0 (5.6) are disposed at least at a second distance ($D_2$, $D_3$) in relation to the first wall of the encasement ($P_1$),
(Continued)

wherein the first distance ($D_1$) is less than the second distance ($D_2$). A compressor (2) and a cooling equipment are also described.

11 Claims, 5 Drawing Sheets

(51) Int. Cl.
*H05K 1/14* (2006.01)
*H05K 7/14* (2006.01)

(52) U.S. Cl.
CPC ............... *H05K 1/14* (2013.01); *H05K 1/141* (2013.01); *H05K 7/1427* (2013.01); *H05K 7/20454* (2013.01); *H05K 1/144* (2013.01); *H05K 7/209* (2013.01)

(58) Field of Classification Search
CPC ........ H05K 1/0204; H05K 1/14; H05K 1/141; H05K 1/144; Y02B 30/70
USPC ........................................................ 361/743
See application file for complete search history.

(56) References Cited

U.S. PATENT DOCUMENTS

| | | | |
|---|---|---|---|
| 2005/0011213 A1* | 1/2005 | Shindo | F04C 23/008 |
| | | | 62/259.2 |
| 2005/0219827 A1 | 10/2005 | Tateyama et al. | |
| 2006/0267192 A1* | 11/2006 | Chen | H05K 7/20445 |
| | | | 257/722 |
| 2007/0076378 A1* | 4/2007 | Blanco | H01L 23/433 |
| | | | 257/E23.09 |
| 2011/0189035 A1* | 8/2011 | Nakagami | F04C 29/047 |
| | | | 62/505 |
| 2015/0216089 A1 | 7/2015 | Tanaka et al. | |
| 2018/0287466 A1* | 10/2018 | Kim | H02M 7/003 |
| 2019/0115808 A1* | 4/2019 | Soda | H05K 7/14324 |

* cited by examiner

ELECTRONIC CONTROL OF A COMPRESSOR, COMPRESSOR AND COOLING EQUIPMENT

CROSS REFERENCE TO RELATED APPLICATIONS

This application is a national stage entry of PCT Application No. PCT/BR2020/050074, filed on Mar. 9, 2020, which claims priority to Brazilian Application No. 102019006685-7, filed on Apr. 2, 2019.

The present invention refers to an electronic control device of a compressor, more specifically to a compact electronic control device and whose disposition of its elements enables efficient thermal dissipation. A compressor and a cooling equipment are also addressed.

DESCRIPTION OF THE STATE OF THE ART

Electronic control devices are commonly used in the state of the art in the control of compressors applied to cooling equipment. For example, in a variable capacity compressor, the electronic control device is, in general terms, responsible for sending commands for altering the rotation speed of the compressor motor and thus enable the temperature of the cooling equipment to be controlled.

One of the problems found in the state of the art lies in the lack of sufficient space for assembling the electronic control device and the compressor. So, there is a constant search for a set (electronic control device and compressor) of reduced size, obviously provided that efficiency and reliability are not lost.

Besides the reduced space, there are also problems linked to the generation of heat both from the compressor and from its electronic control device.

It is known that during the operation of a compressor used in cooling equipment said compressor tends to heat up, said generation of heat may compromise the operation of the electronic control device itself of the compressor, compromising the efficiency and reliability of its components (sensitive to temperature).

Similarly, the electronic control device itself of the compressor tends to generate heat during its operation, meaning that said energy is absorbed by elements sensitive to temperature and also compromising the operation of the electronic control device.

So, the search in the state of the art for a compact electronic control device having efficient heat characteristics is ongoing.

From the state of the art related to the present invention, it is known that electronic control devices applied to compressors are usually formed by a single printed circuit board endowed with two or more layers, wherein the electronic components are disposed in said layers.

The state of the art also discloses publications wherein the electronic control device is formed by a main board associated to auxiliary boards, as described in the prior art US 2018/0287466, wherein a circuit apt to control an electric motor is described. Possibly in an attempt to compact the proposed circuit, said prior art makes use of "daughter" electronic boards associated to a main board, wherein said association occurs by encasement, using the referenced slots for such.

It so happens that said prior art errs by disclosing means for improving the thermal efficiency of the electronic board and electric motor set, which compromises to a great extent the operation of the electric motor associated to the electronic circuit.

Additionally, said prior art shows no concern relating to the form of disposition of the so-called daughter boards in relation to main board, as well as the disposition of the electronic components of each one of the boards.

As seen from the teachings of the present invention, the form of disposition of an electronic control device and its components is essential for the compression and thermal efficiency thereof.

The state of the art also discloses prior art EP 1,617,081, describing a compressor wherein the circuit of the inverter (electronic control device) is disposed inside the shell of the compressor.

It so happens that said European prior art focuses on the description so that the compressor is apt to carry the inverter inside its shell, such that the inverter is hermetically disposed in the shell of the compressor.

On the other hand, document EP 1,617,081 errs in describing characteristics linked to the disposition of the boards of the inverter as well as forms of overcoming problems related to the dissipation of heat, and these problems definitely occurs when the objective is to dispose the inverter inside the shell of the compressor, as occurs in EP 1,617,081.

Additionally, document U.S. Pat. No. 6,704,202 discloses a compact-size as well as an inexpensive power controller. Highly heat-dissipating first board including an inverter circuit mounted thereon and second board including a control circuit mounted thereon are placed in parallel with each other and accommodated by case. Case has slits through which heat sink and connector can extend outside case, and further has fixing section for fixing case to a compressor. This structure allows the power controller to dissipate heat in an optimum manner and to be downsized, and also allows the compressor to integrate the controller thereinto. A capacity that the controller occupies in the refrigerating system can be substantially reduced. However, the physical layout of the temperature sensitive components 7 and 54 are in an unfavorable position from the thermal point of view, being subject to heating by both conduction and convection. In opposition, the great benefit of the present invention is the physical distance between heat sources and temperature sensitive components, improving the reliability of the product.

Document US2005/219827 discloses an electrical circuit device that includes a controller, drivers, auxiliary plates, and a case. The controller inputs driving signals to the drivers. The drivers have multiple semiconductor relays that turn on and off power supply to electrical loads based on the driving signals. The drivers are housed in the case. The driving signals are transmitted from the controller to the drivers via serial communication. With this configuration, the number of communication lines and the communication connectors and the size of the electrical circuit device are small with respect to parallel communication. When another driver is added, only software modification of the controller and addition of a serial communication line between the controller and the driver are required. Thus, the electrical circuit device can be easily modified for different models of vehicles. However, in opposition, the use of auxiliary plates is not the focus of the present invention. The present invention aims to protect the arrangement of these plates, offering the best thermal management.

Further, document US 2015/216089 discloses a control circuit with a power module fixed closer to a side wall of the casing than other circuit boards which produce less heat. This document addresses a liquid circulation cooling structure. This structure has several heat generating bodies, which are cooled by the same cooling body (metallic heatsink). However, in opposition, the present application does not require the cooling of different plates, but the thermal management between heat sources and sensitive components.

The present invention is intended to overcome the problems existing in the state of the art by way of an electronic control device whose disposition of its boards enables due compacting as well as efficient thermal dissipation.

More specifically, the present invention presents an electronic control device wherein the thermally most sensitive components are set aside from those components that generate more heat, therefore, the efficiency and reliability of the electronic control device will not be compromised.

Additionally, the electronic control device proposed in the present invention makes use of auxiliary boards associated to a main board, wherein the form of association proposed between the auxiliary boards and the main board boosts the compaction of the electronic control device that is the object of the present invention.

The advantages obtained from the teachings of the present invention will be addressed in detail during the course of the present specification.

OBJECTIVES OF THE INVENTION

The objective of the present invention is to provide an electronic control device of a compressor, wherein the electronic control device is formed by a main electronic board and by at least an auxiliary electronic board.

Another objective of the present invention is to provide an electronic control device whose disposition enables heat-generating elements of the electronic control device to be set aside from the elements sensitive to temperature.

An additional objective of the present invention lies in providing an electronic control device wherein one of its electronic boards is a board that concentrates most of the heat-generating elements, wherein the disposition of the heat-generating board in the electronic control device enables improved dissipation of the heat generated by said board.

It is also an objective of the present invention to provide an electronic control device wherein the heat-generating board is disposed at a first distance in relation to a wall of an encasement, wherein the other auxiliary boards are disposed at a second distance from this same wall, wherein the first distance is less than the second distance.

An additional objective of the present invention lies in providing an electronic control device wherein an operation face of the heat generating board faces (towards) a first wall of the encasement, such that the operation face of the other auxiliary boards faces a second wall of the encasement, such that the first wall is opposite the second wall.

It is also an objective of the present invention to provide an electronic control device endowed with a main board and three auxiliary boards.

Another objective of the present invention is to provide an electronic control device wherein the association of the auxiliary boards to the main board occurs by way of a soldering process.

An additional objective of the present invention consists of providing a compressor and a cooling equipment, the compressor comprising the electronic control device defined in the present invention.

It is a further objective of the present invention to provide a cooling equipment endowed with the electronic control device proposed in the present invention.

BRIEF DESCRIPTION OF THE INVENTION

The objectives of the present invention are achieved by way of an electronic control device of a compressor, the electronic control device disposed in an encasement and comprising a main board associated to at least an auxiliary board, wherein one of the auxiliary boards is a heat generating board, wherein the heat-generating board is disposed at a first distance in relation to a first wall of the encasement, this first wall being related to the upper part of the encasement considering the final position of application of the electronic control device, and the other auxiliary boards are disposed at least at a second distance in relation to the first wall of the encasement, wherein the first distance is less than the second distance.

SUMMARY DESCRIPTION OF THE DRAWINGS

The present invention will now be described in greater detail based on an exemplary embodiment represented in the drawings. The figures show.

DETAILED DESCRIPTION OF THE DRAWINGS

The present invention initially describes an electronic control device 1, as can be seen from FIGS. 1 to 5.

In a fully valid embodiment of the present invention, said electronic control device 1 can be applied to the control of a compressor 2, more specifically, the electronic control device 1 can be used to control the speed of the electric motor of the compressor 2.

In any case, it is emphasized that the application of the electronic control device 1 for the control of a compressor 2 should not be considered as a limitative characteristic of the present invention, such that the electronic control device 1 proposed herein could very well be used in various other applications, such as the control of motors in general and integrated controls for compressor and refrigerator.

Figure 1:
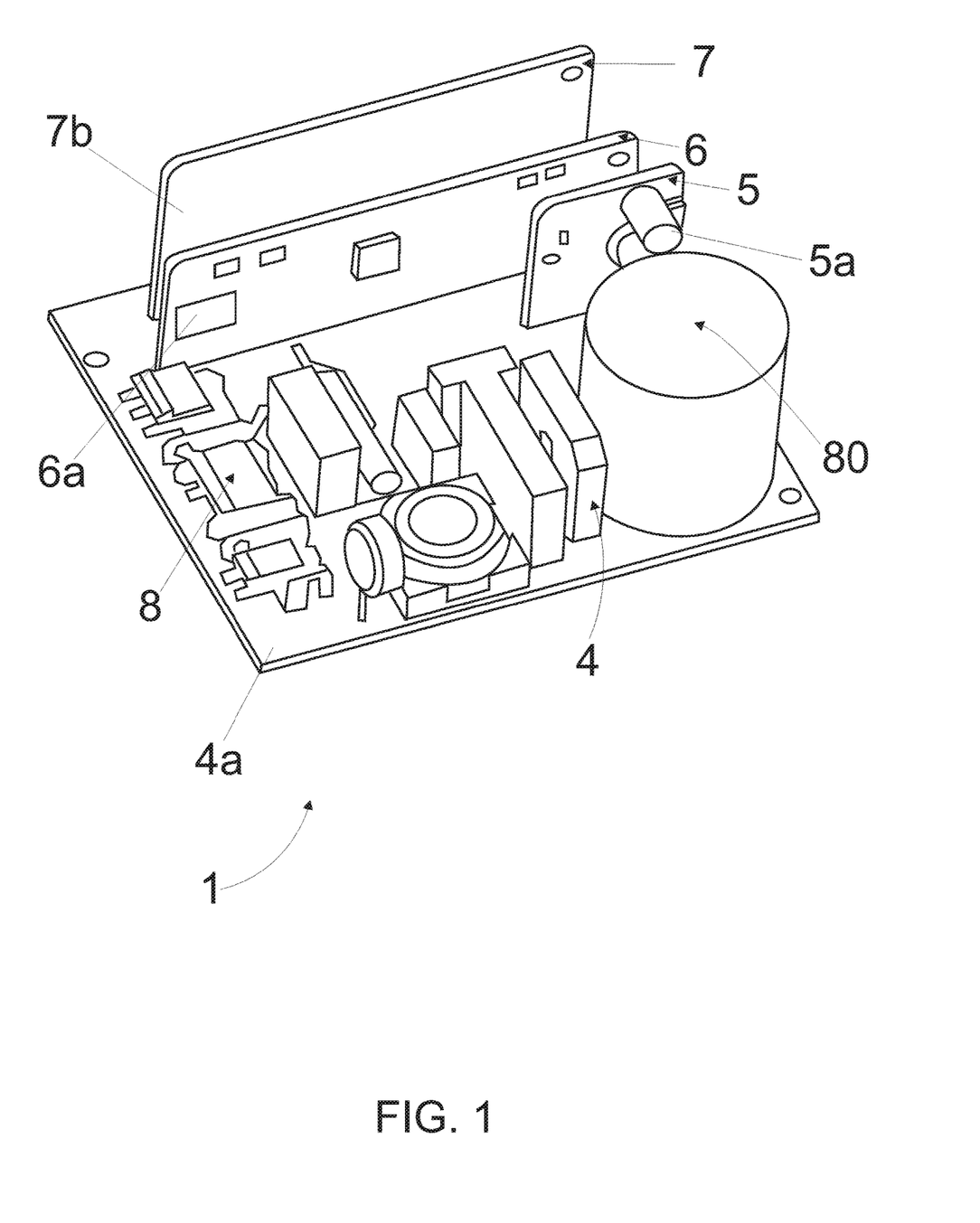
FIG. 1—is a representation of the electronic control device proposed in the present invention, showing its main board and its auxiliary boards.
Figure 2:
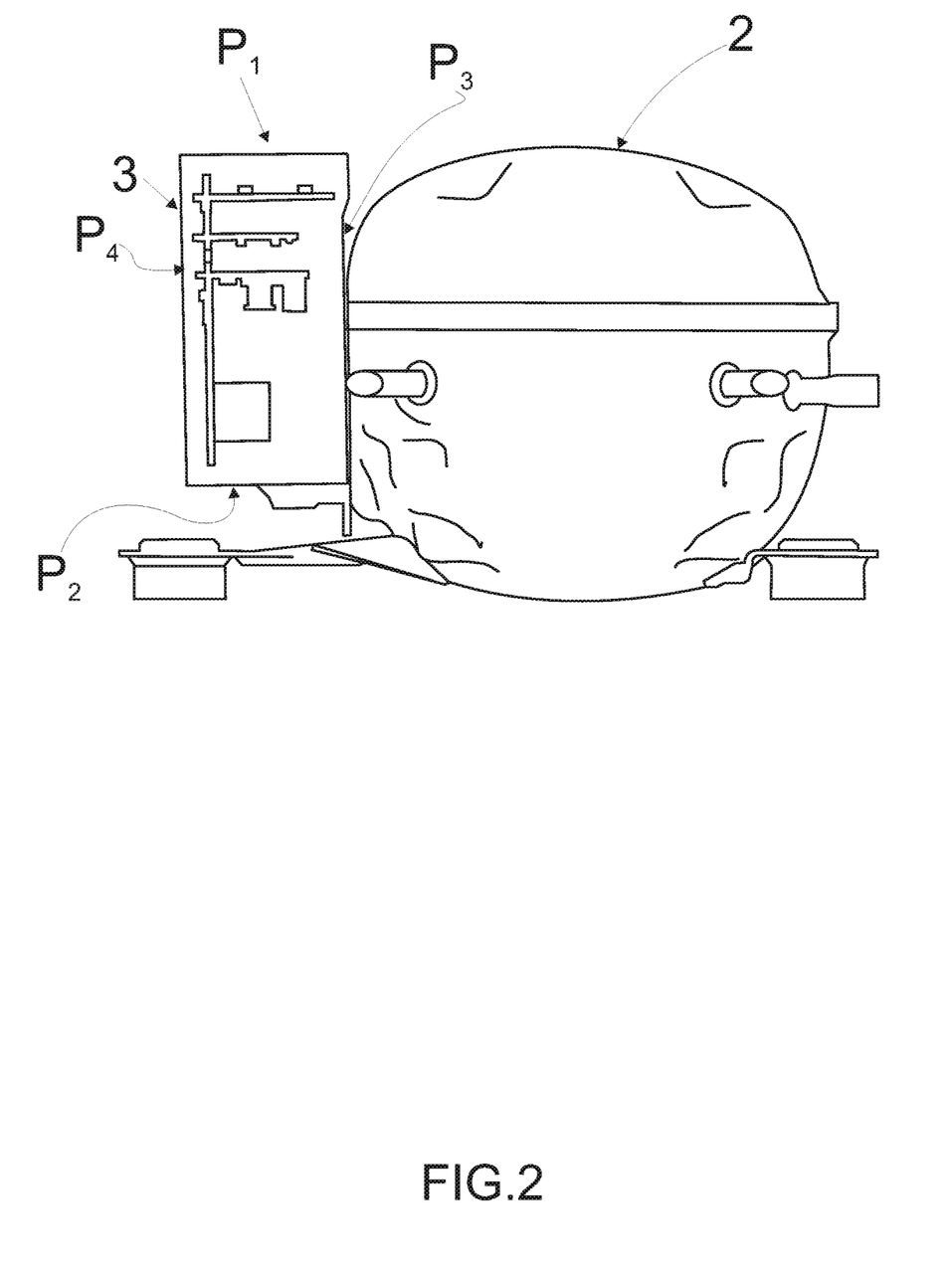
FIG. 2—is a cutaway representation of the electronic control device proposed in the present invention disposed in an encasement of a compressor.

In a valid embodiment of the present invention and in reference to FIGS. 1 and 2, said electronic control device 1 is used in the control of a compressor 2 applied to a cooling equipment, such that cooling equipment is understood to be any refrigerator and/or freezer, be it domestic and/or commercial as well as any air-conditioning equipment, be it domestic, residential, portable, and applied to motor vehicles.

In any case, the application of the teachings of the present invention to a cooling equipment should not be considered as a limitative characteristic of the invention.

Figure 3:
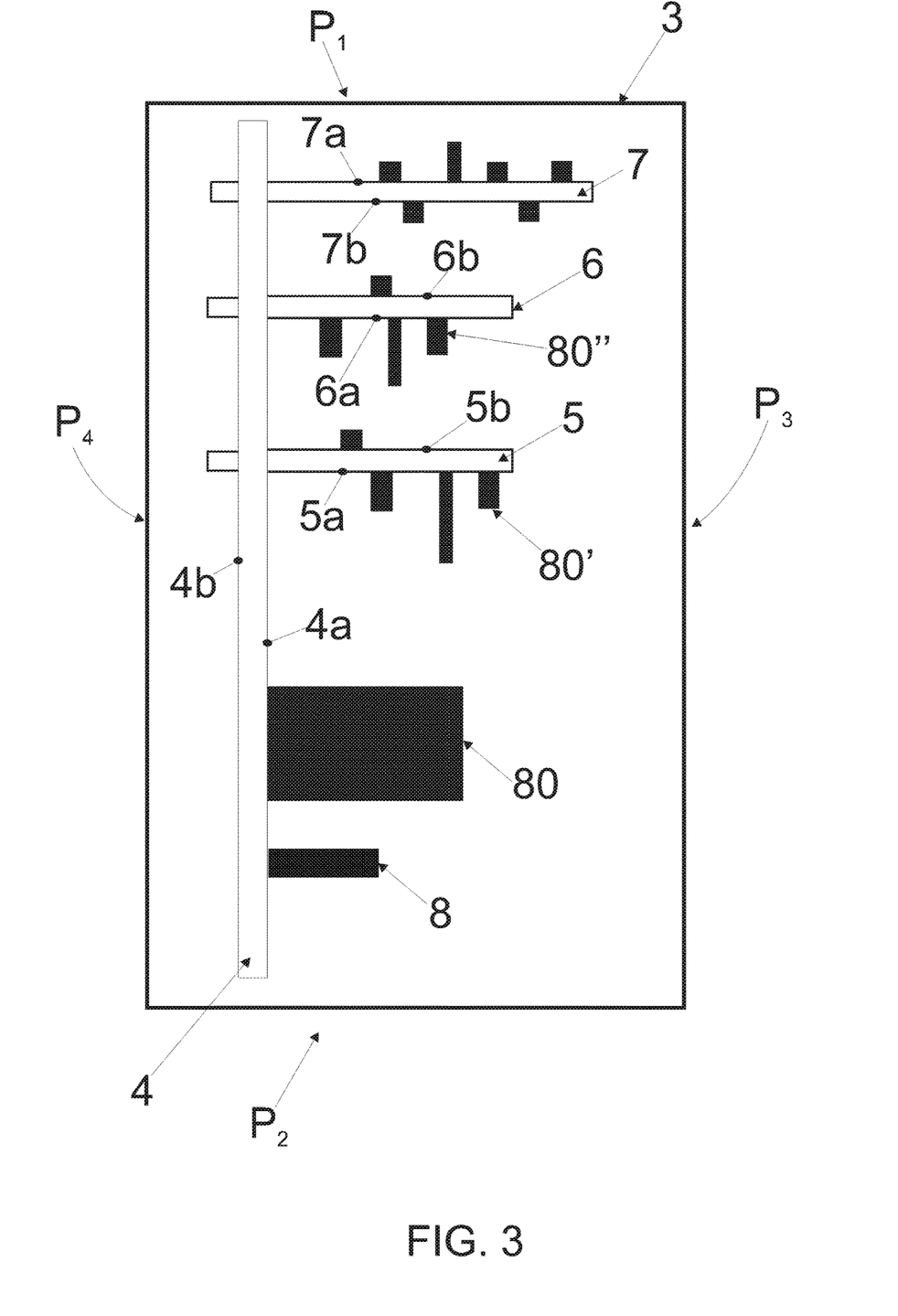
FIG. 3—is a cutaway representation of the electronic control device proposed in the present invention disposed inside an encasement.

For due packaging and protection of the electronic control device 1, it is proposed that it be disposed in an encasement 3, as represented in FIGS. 2 and 3.

It is emphasized that the illustration of the encasement 3 in the figures in question should not be considered as a limitative characteristic of the present invention, such that encasement 3 should be understood to be any element able to offer protection to the electronic control device 1, and encasement 3 can also be understood to be any site for storing the control 1, such as a plastic box, metal box, any type of cabinet, the very shell of the compressor, among others.

In this embodiment of the present invention illustrated in FIGS. 2 and 3, the encasement 3 can be understood as a rectangular box of side walls P1, P2, P3 and P4 wherein the electronic control device 1 is disposed in the inner area of said encasement 3.

In reference to FIGS. 1 to 4, the present invention proposes that the electronic control device 1 be formed by an electronic board 4 (main board 4) and by at least an auxiliary board 5 (auxiliary electronic board 5).

In this embodiment of the present invention, it is proposed that three auxiliary boards 5, 6 and 7 be used, as represented in FIGS. 1 to 4. It is emphasized that the amount of auxiliary boards referred to in the present invention should not be considered as a limitative characteristic of the teachings proposed herein, such that any amount of auxiliary boards could be used.

The auxiliary electronic boards 5, 6 and 7 can be respectively understood as a first auxiliary board 5, a second auxiliary board 6 and a third auxiliary board 7.

It is also understood that the main board 4 and each one of the auxiliary boards 5,6 and 7 comprises an operation face 4a, 5a, 6a, 7a and a track face 4b, 5b, 6b, 7b.

In specific reference to FIGS. 1 and 3, the operation face 4a, 5a, 6a, 7a of the boards in question 4, 5, 6 and 7 should be under stood with the face of the electronic boards wherein most of the electronic components 8 (capacitors, resistors, diodes, transistors, varistors, among others) are disposed. Most electronic components 8 should be understood as the face of the boards 4, 5, 6 and 7 which comprises a greater quantity of electronic components when compared to the opposite face of the board in question.

So, FIG. 3 spotlights the operation face 4a, 5a, 6a, 7a of each one of the electronic boards 4, 5, 6 and 7.

The track face 4b, 5b, 6b, 7b should be understood as the face opposite the operation face 4a, 5a, 6a, 7a, so the track face 4b, 5b, 6b, 7b can be understood as the face that comprises most of the conducting tracks of the board. In any case, it is emphasized that the track face 4b, 5b, 6b, 7b may also contain some electronic components 8 on its surface.

Generally speaking, the operation face 4a, 5a, 6a, 7a can be understood as the face preferably used for housing the electronic components 8, while the track face 4b, 5b, 6b, 7b can be understood as being the preferred face for disposing the conducting tracks, the track face 4b, 5b, 6b, 7b may also contain electronic components 8.

Further and considering that a certain electronic component 8 is fastened to the main board 4 by means of a soldering process, the track face 4b can be understood as a face wherein the soldering points are visible.

Generally speaking, the track face should be understood as the face opposite the face that comprises most electronic components 8.

In this sense, FIG. 3 illustrates the track face 4b, 5b, 6b, 7b of each one of the electronic boards 4, 5, 6, 7 which make up the electronic control device 1 proposed in the present invention.

From the teachings described above, it is understood that FIG. 1 respectively allows the visualization of the operation face 4a, 5a and 6a of the main electronic board 4 and auxiliary boards 5 and 6 as well as the visualization of the track face 7b of the third auxiliary electronic board 7.

An important characteristic of the electronic control device 1 proposed in the present invention lies in the disposition and arrangement of the main electronic board 4 in addition to the auxiliary boards 5, 6, and 7. More specifically, it is proposed that each auxiliary board 5, 6 and 7 as well as the main board 4 represents a certain operation board of the electronic control device, wherein each operation board will comprise the specific and necessary electronic components for the operation of said board.

Further, and as described in detail ahead, the disposition site and arrangement of the auxiliary boards 5, 6 and 7 and main board 4 (and its operation boards) also refer to an important characteristic of the present invention.

The main electronic board 4 can be understood as a mother board that concentrates all the PTH (pin through holej components of the electronic control device 1, that is, those electronic components 8 whose terminals are inserted into the holes (orifices) of the electronic board 4 and are then fastened thereto, for example, by means of soldering.

In this embodiment of the present invention, the electronic board 4 comprises the following electronic components 8: connectors, EMC filter, fuse, rectifier diodes, busbar capacitors, cables, jumpers, besides obviously comprising the auxiliary boards 5, 6 and 7 as well.

So, the main board 4 can be understood as a fastening board, and this board is responsible for concentrating the PTH components of the electronic control device 1, as described previously.

Similarly, the present invention proposes that the first auxiliary electronic board 5 be configured as a power board, more specifically, the electronic board 5 can be understood as an SMPS board (switched mode power supply), thus being responsible for providing low-voltage power to the other boards of the product.

Therefore, and in a configuration of the present invention, the auxiliary electronic board 5 comprises the following electronic components 8: integrated SMPS circuit, inductor, voltage regulator, capacitors, diodes, and resistors.

Configuring the first auxiliary board 5 in a power board, as proposed, it is entirely possible to design various auxiliary boards 5 with different efficiencies, such that for each type of application desired, an auxiliary board 5 with the desired efficiency can be used.

So, if there is a need to change the efficiency of the electronic control device 1, there is the possibility of replacing just the auxiliary board 5, not making any alteration to the main board 4 or to the other auxiliary boards 6 and 7 either.

Similarly to that described above, the second auxiliary board 6 represents a control board of the electronic control device 1. More specifically, the auxiliary board 6 concentrates the opto-communication couplers, microprocessor, microcontroller and its peripherals.

Therefore, it is possible to design only a new auxiliary board 6 if it is desirable to alter the microcontroller/microprocessor of the electronic control device 1, thus not affecting the other boards of the control 1. Similarly, should the need for repair and/or replacement arise, it is possible to substitute only the second board 6, which ends up significantly reducing the costs involved.

The third auxiliary board 7 acts as an inverter board, said board 7 comprising the electronic keys responsible for driving the electric motor of the compressor 2, and also for comprising drivers and peripheral circuits of the electronic control device 1.

Therefore, and for effectively concentrating the components necessary for the operation of the electric motor of the compressor 2, the inverter board (third board 7) is understood to be the one that generates most heat in the electronic control device 1. Put otherwise, when compared to the other boards of the electronic control device 1 (main board 4 and auxiliary boards 5 and 6), the third auxiliary board 7 is the one that generates most heat (coming essentially from the operation of the electronic keys), and can thus be understood as a heat-generating board.

Therefore, heat-generating board 7 should be understood to be the board of the electronic control device 1 that generates most heat.

Considering the inverter board (third auxiliary board 7) as the one that generates most heat in the electronic control device 1, the disposition and arrangement of the auxiliary boards 5, 6 and 7 assumes an important characteristic in the electronic control device 1 proposed in the pre sent invention.

Specifically, and viewing the best possible thermal performance for the electronic control device 1, this embodiment of the present invention proposes that a heat-generating board 7 be distanced from the other components of the control device 1, especially those components most sensitive to temperature. In an embodiment of the present invention, components most sensitive to temperature can be understood as the busbar capacitor 80 disposed on the main board 4, the capacitor 80' disposed on the first auxiliary board 5 and the microprocessor 80" dis posed on the second auxiliary board 6, as represented in FIG. 3.

Figure 4:
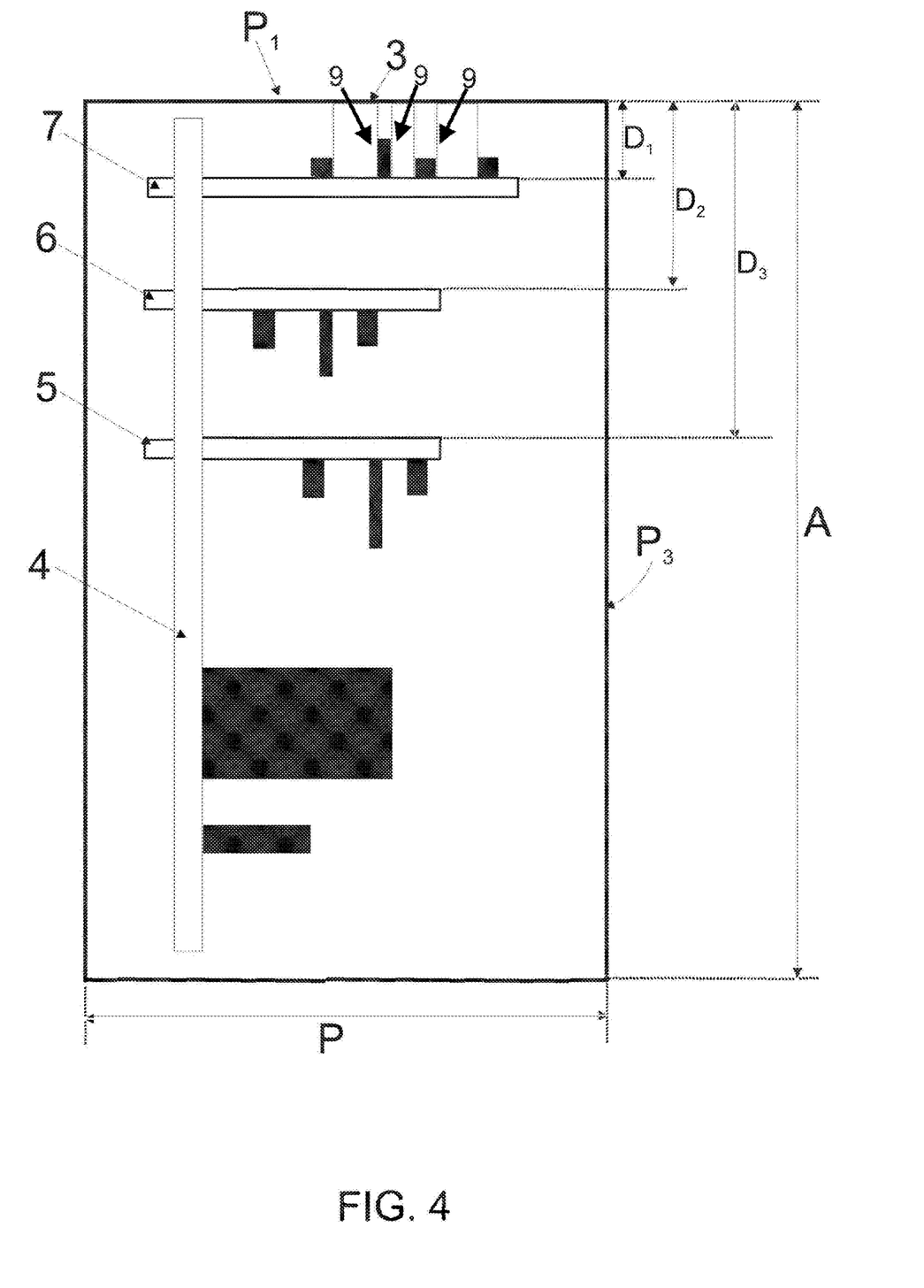
FIG. 4—is an additional cutaway representation of the electronic control device proposed in the present invention disposed inside an encasement.

FIGS. 2, 3 and 4 illustrate a valid arrangement for disposing the electronic control device 1 considering the teachings of the present invention. It is emphasized that the FIG. 2 illustrates a valid disposition of the control 1 in relation to the compressor 2, since the FIGS. 3 and 4 only illustrate the electronic control device 1 and considering the arrangement form displayed in FIG. 2.

As already described previously, it is proposed that the electronic control device 1 be disposed in an encasement 3, such that said encasement should be associated to the compressor 2, according to the illustration in FIG. 2. In the embodiment represented in this figure, it is noted that the electronic control device 1 is disposed next to the compressor 2 such that the main board 4 be disposed vertically (with its operation face 4a towards the compressor 2) in any case, any other disposition arrangement would be fully acceptable.

Providing important thermal advantages for the electronic control device 1 described in the present invention, it is proposed that the board generating most heat in the control 1, that is, the third auxiliary board 7 be distanced from the other boards of the electronic control device 1.

Therefore, the present invention proposes that the heat generating board 7 be disposed at a first distance D1 in relation to the first wall of the encasement P1, reference is made to FIG. 4. Therefore, the other auxiliary boards 5 and 6 must be respectively disposed at a second D2 and third distances D3 in relation to the same wall P1.

As illustrated in FIG. 4, it is proposed that the first distance D1 be less than the second and third distances D2 and D3, that is, the heat-generating board 7 is nearer the first wall P1 than the other auxiliary boards 5 and 6.

Another important characteristic of the electronic control device 1 proposed herein and viewing efficient thermal dissipation of the heat generated chiefly on the third auxiliary board 7, it is proposed that the operation face 7a of the heat-generating board 7 faces the first wall of the encasement P1, as represented in FIG. 3.

So "to face" means that the operation face 7a of the heat generating board 7 faces towards the first wall P1, as represented in FIGS. 3 and 4.

Similarly, and still in reference to FIGS. 3 and 4, the auxiliary boards 5 and 6 should preferably be disposed such that the operation face 5a, 6a of said boards faces towards the second wall of the encasement P2, wherein the first wall P1 is opposite the second wall P2, as represented in FIG. 3.

More specifically, and still in reference to FIG. 3, it is noted that the operation face of the second auxiliary board 6a faces the track face of the first auxiliary board 5b, while the track face of the second auxiliary board 6b faces the track face 7b of the heat-generating board 7.

This form of disposition guarantees that the thermally most sensitive components, such as the busbar electrolyte capacitor 80 disposed on the main board 4, the microprocessor 80" disposed on the auxiliary board 6 and the electrolyte capacitor 80' disposed on the auxiliary board 5 will undergo significantly less interference from the heat generated by the third auxiliary board 7, thus improving the efficiency and reliability of the electronic control device 1.

Further in relation to the disposition and arrangement proposed for the electronic control device 1, it is noted that the operation face 4a of the main board 4 faces a third wall P3 of the encasement, the third wall P3 being adjacent to the first wall P1 and the second wall P2, as illustrated in FIGS. 3 and 4. More specifically, and also based on the illustration of FIG. 2, it is noted that the operation face 4a of the mother board (main board) faces the side portion of the compressor 2.

The disposition of the electronic components 8 of the mother board on a lateral plane to the body of the compressor, as described above, hinders the thermal exchange with the environment via convection, which ultimately boosts the operation of the electronic control device 1, since the main board 4 is the one that comprises one of the components 8 most sensitive to temperature (busbar capacitor 80).

Therefore, the disposition proposed ends up distancing the heat-generating board 7 of the thermally most sensitive components and which are disposed on the main board 4, in other words, with the arrangement in question the auxiliary boards 5 and 6 act as a shield, thus protecting the thermally most sensitive components and which are disposed on the main electronic board 4.

Furthermore, the proposal in question of disposition of the heat-generating board 7, such that its operation face 7a faces the first wall P1 ultimately improves the thermal efficiency of the system. In a non-limitative manner, the first wall P1 should be understood as the upper wall of the encasement 3 which stores the electronic control device 1, the electronic control device 1 and the encasement 3 being mounted in their final use position. This final use position is illustrated in FIG. 2.

Figure 5:
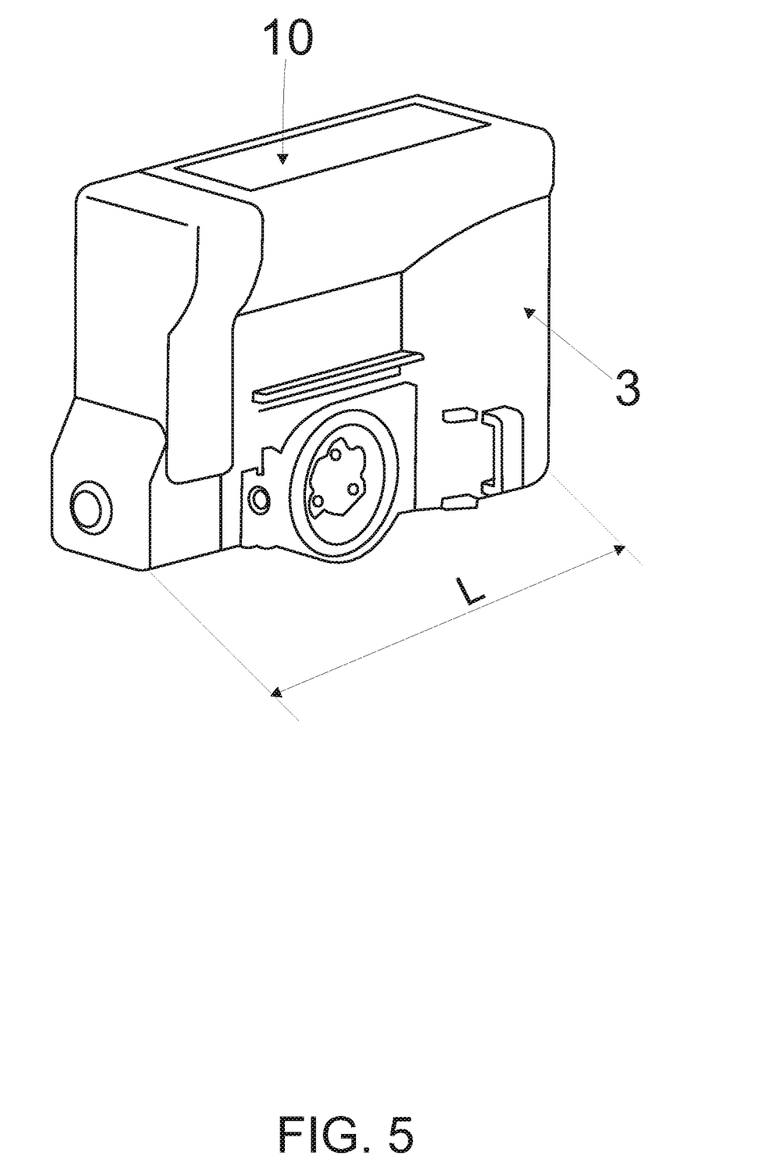
FIG. 5—is a perspective and highlighted representation and of an encasement used to package the electronic control device proposed in the present invention.

In this sense, and with a view to further boost the characteristics linked to the thermal dissipation of the electronic control device 1, it is proposed that the first wall Pi of the encasement 3 comprise a heat dissipator 10, as represented in FIG. 5.

Generally speaking, the heat dissipator 10 can be understood as a board made of metal material, such as aluminum, the objective of which is to transfer the heat generated by the third auxiliary board 7 directly to the environment.

In one configuration, the very wall of the encasement (first wall P1) may configure the heat dissipator 10, so it is understood that the very wall P1 can be made of metal material, thus acting as the heat dissipator 10. In another fully valid configuration, the heat dissipator 10 can be associated to the first wall P1, and said wall may be made of any material, such as a polymer material.

Furthermore, and in reference to FIG. 4, it is proposed that the electronic control device 1 further comprise a conducting adhesive 9 associated to the operation face 7a of the heat-generating board 7, specifically, the conducting adhesive 9 is responsible for transmitting, by conduction, the heat generated in the components of the auxiliary board 7 to the heat dissipator 10, so subsequently the heat is dissipated to the environment, by convection and irradiation.

It is emphasized that the form and the disposition site of the conducting adhesive 9, as represented in FIG. 4, should not represent a limitative characteristic of the present invention.

In a non-limitative characteristic of the present invention, it is proposed that the association between the auxiliary boards 5, 6 and 7 and the main board 4 occur by way of a soldering process. Preferably, said association occurs by way of a wave soldering process which results in an electronic control device 1 endowed with sufficient mechanical stress and vibration.

In any case, it is emphasized that in the use of the soldering process, the wave should not be considered as a limitation of the pre sent invention, to the extent that other forms of association would be fully acceptable, such as the use of selective soldering or soldering by robot.

So what is proposed here is an electronic control device 1 wherein the auxiliary boards 5, 6 and 7 are disposed concurrently to the main electronic board 4, that is, it is understood that the plans defined by each one of the auxiliary boards 5, 6 and 7 are concurrent to the plane defined by the main board 4, as represented in FIGS. 1 to 4.

In a non-limitative characteristic of the present invention, and as represented in FIGS. 1 to 4, the auxiliary boards 5, 6 and 7 are disposed perpendicularly to the main board 4, in any case, it is under lined that other forms of disposition would be acceptable, such as the disposition of at least one of the boards 5, 6 and 7 slantedly in relation to the main board 4.

In another valid configuration, at least one of the auxiliary boards 5, 6 and 7 could be disposed perpendicularly in relation to the main board 4, such that the other boards of the electronic control device could be disposed slantedly in relation to the board 4.

Furthermore, the disposition of the auxiliary boards 5, 6 and 7 in parallel to each other should not represent a limitation of the present invention either.

So, what is proposed is an electronic control device 1 with efficient operation and excellent thermal and electromagnetic characteristics, also being compact, able to be disposed in an encasement 3 with dimensions preferably in the range of 120 (L)×90 (A)×45 (P) mm.

Further, and without entailing limitations to the teachings of the present invention, it is proposed that the main board 4 be configured as a single layer board and as daughter boards 5, 6 and 7 be con figured as dual layer boards, that is, boards that enable the disposition of electronic components on the two faces of the board. It is under lined that this characteristic does not refer to a limitation of the present invention.

The present invention further proposes a compressor 2 used in a cooling equipment, wherein the compressor 2 comprises an electronic control device 1 as previously described.

Lastly, a cooling equipment is further proposed, endowed with an electronic control device 1 as proposed in the present invention.

Having described an example of a preferred embodiment, it should be understood that the scope of the present invention encompasses other possible variations, being limited solely by the content of the accompanying claims, potential equivalents being included therein.

The invention claimed is:

1. An electronic control device (1) of a compressor (2), the electronic control device (1) disposed in an encasement (3), wherein the electronic control device (1) comprises:
    a main board (4) associated to a plurality of auxiliary boards (5, 6, 7), wherein the electronic control device (1) is characterized in that:
    one of the auxiliary boards (5, 6, 7) is a heat-generating board (7) that generates the most heat among the auxiliary boards (5, 6, 7), the heat-generating board (7) of one of the auxiliary boards (5, 6, 7) comprising a conducting adhesive (9),
    a heat dissipator (10),
    wherein the heat-generating board (7) is disposed at a first distance (D1) in relation to a first wall of the encasement (3),
    wherein the first wall of the encasement (3) comprises the heat dissipator (10),
    wherein the other auxiliary boards (5, 6) are disposed at least at a second distance (D2, D3) in relation to the first wall of the encasement (3),
    wherein the first distance (D1) is less than the second distance (D2),
    wherein each auxiliary board (5, 6, 7) and the main board (4) comprises an operation face (4a, 5a, 6a, 7a) and a track face (4b, 5b, 6b, 7b), wherein the operation face (7a) of the heat-generating board (7) faces the first wall of the encasement (3) and the operation face (5a, 6a) of the other auxiliary boards (5, 6) faces a second wall of the encasement (3), wherein the first wall (P1) is opposite the second wall (P2),
    wherein the auxiliary boards (5, 6, 7) are formed by:
        a first auxiliary board (5) configured as a power board, a second auxiliary board (6) configured as a control board, and a third auxiliary board (7) configured as an inverter board, wherein the third auxiliary board (7) is the heat-generating board (7);
        wherein the third auxiliary board (7) comprises the conducting adhesive (9) on the operation face (7a), the conducting adhesive (9) configured to dissipate heat, through the first wall of the encasement (3), from the third auxiliary board (7) to the heat dissipator (10);
    wherein a busbar capacitor (80) is disposed on the operation face (4a) of the main board (4);
    wherein the first auxiliary board (5) and the second auxiliary board (6) are disposed between the busbar capacitor (80) and the third auxiliary board (7);
    wherein a capacitor (80') is disposed on the operation face (5a) of the first auxiliary board (5);
    wherein a microprocessor (80") is disposed on the operation face (6a) of the second auxiliary board (6).

2. The electronic control device (1) according to claim 1, characterized in that an association between the auxiliary boards (5, 6, 7) and the main board (4) occurs by way of a soldering process.

3. The electronic control device (1) according to claim 1, characterized in that the operation face (4a, 5a, 6a, 7a) is the face of the auxiliary boards (5, 6, 7) and of the main board (4) which comprises a majority of electronic components (8) of the auxiliary boards (5, 6, 7) and the main board (4).

4. The electronic control device (1) according to claim 1, characterized in that each auxiliary board (5, 6, 7) is disposed concurrently in relation to the main board (4).

5. The electronic control device (1) according to claim 4, characterized in that at least one of the auxiliary boards (5, 6, 7) is disposed perpendicularly in relation to the main board (4).

6. The electronic control device (1) according to claim 5, characterized in that the operation face (4a) of the main board (4) faces a third wall (P3) of the encasement, the third wall (P3) being adjacent to the first (P1) and second wall (P2) of the encasement.

7. The electronic control device (1) according to claim 6, characterized in that the operation face (4a) of the main board (4) further faces the compressor (2).

8. The electronic control device (1) according to claim 7, characterized in that the operation face of the second auxiliary board (6a) faces the track face of the first auxiliary board (5b) and the track face of the second auxiliary board (6b) faces the track face of the third auxiliary board (7b).

9. The electronic control device (1) according to claim 2, characterized in that the soldering process is a wave soldering process.

10. The electronic control device (1) according to claim 1, wherein the electronic control device (1) is disposed in the compressor (2), the compressor being provided for cooling equipment.

11. The electronic control device (1) according to claim 1, wherein the electronic control device (1) is disposed in cooling equipment.

* * * * *